United States Patent
Tung

(10) Patent No.: US 10,580,864 B2
(45) Date of Patent: Mar. 3, 2020

(54) METHOD OF FORMING SEMICONDUCTOR DEVICE

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/022,737

(22) Filed: Jun. 29, 2018

(65) Prior Publication Data

US 2018/0308933 A1    Oct. 25, 2018

Related U.S. Application Data

(62) Division of application No. 15/152,570, filed on May 12, 2016, now abandoned.

(30) Foreign Application Priority Data

Mar. 22, 2016 (TW) .............................. 105108724 A

(51) Int. Cl.
*H01L 29/10* (2006.01)
*H01L 29/78* (2006.01)
(Continued)

(52) U.S. Cl.
CPC .... *H01L 29/1054* (2013.01); *H01L 21/02634* (2013.01); *H01L 21/3085* (2013.01);
(Continued)

(58) Field of Classification Search
CPC ........... H01L 29/1054; H01L 21/02634; H01L 21/3085; H01L 21/76278; H01L 29/0649; H01L 29/165; H01L 31/0328; H01L 31/0336; H01L 31/072; H01L 31/109; H01L 29/06; H01L 29/66795; H01L 29/7853; H01L 29/7842; H01L 21/823431
USPC ........ 438/222, 294, 478; 257/190, 288, 192, 257/618
See application file for complete search history.

(56) References Cited

U.S. PATENT DOCUMENTS 8,765,546 B1    7/2014 Hung
9,142,418 B1    9/2015 Jung
(Continued)

FOREIGN PATENT DOCUMENTS

EP    2933842    10/2015

OTHER PUBLICATIONS

Huang, Title of Invention: Semiconductor Structure and Manufacturing Method Thereof, U.S. Appl. No. 14/941,674, filed Nov. 16, 2015.

*Primary Examiner* — Mouloucoulaye Inoussa
(74) *Attorney, Agent, or Firm* — Winston Hsu

(57) ABSTRACT

The present invention provides a semiconductor device, including a substrate, a first semiconductor layer, a plurality of first sub recess, a plurality of insulation structures and a first top semiconductor layer. The substrate has a first region disposed within an STI. The first semiconductor layer is disposed in the first region. The first sub recesses are disposed in the first semiconductor layer. The insulation structures are disposed on the first semiconductor layer. The first top semiconductor layer forms a plurality of fin structures, which are embedded in the first sub recesses, arranged alternatively with the insulation structures and protruding over the insulation structures.

15 Claims, 12 Drawing Sheets

(51) Int. Cl.
  *H01L 29/66* (2006.01)
  *H01L 21/02* (2006.01)
  *H01L 21/308* (2006.01)
  *H01L 21/762* (2006.01)
  *H01L 27/088* (2006.01)
  *H01L 21/8234* (2006.01)
  *H01L 29/06* (2006.01)
  *H01L 29/165* (2006.01)

(52) U.S. Cl.
  CPC ............. *H01L 21/76278* (2013.01); *H01L 21/823431* (2013.01); *H01L 27/0886* (2013.01); *H01L 29/0649* (2013.01); *H01L 29/165* (2013.01); *H01L 29/6681* (2013.01); *H01L 29/66795* (2013.01); *H01L 29/785* (2013.01)

(56) References Cited

U.S. PATENT DOCUMENTS

| | | | |
|---|---|---|---|
| 9,147,766 B2 | 9/2015 | Wang | |
| 9,171,752 B1 | 10/2015 | Wu | |
| 9,171,929 B2 | 10/2015 | Lee | |
| 9,175,953 B2 | 11/2015 | Kuramoto | |
| 9,219,112 B2 | 12/2015 | Lochtefeld | |
| 2006/0134868 A1* | 6/2006 | Yoon | H01L 21/823437 438/283 |
| 2007/0155148 A1 | 7/2007 | Kim | |
| 2010/0163926 A1 | 7/2010 | Hudait | |
| 2012/0319211 A1 | 12/2012 | van Dal | |
| 2013/0043506 A1 | 2/2013 | Tsai | |
| 2014/0141582 A1 | 5/2014 | Ching | |
| 2014/0151766 A1 | 6/2014 | Eneman | |
| 2014/0332900 A1* | 11/2014 | Basu | H01L 29/66522 257/401 |
| 2015/0123166 A1 | 5/2015 | Jacob | |
| 2015/0141582 A1* | 5/2015 | Yan | C08C 19/44 525/384 |
| 2015/0243509 A1* | 8/2015 | Chan | H01L 29/0649 257/506 |
| 2015/0294969 A1* | 10/2015 | Lee | H01L 27/0886 257/401 |
| 2015/0295090 A1 | 10/2015 | Tsai | |
| 2015/0318176 A1 | 11/2015 | Qi | |
| 2016/0079126 A1 | 3/2016 | Zhang | |
| 2016/0104673 A1* | 4/2016 | Tung | H01L 21/76897 257/288 |
| 2016/0225906 A1 | 8/2016 | Wang | |

* cited by examiner

METHOD OF FORMING SEMICONDUCTOR DEVICE

CROSS REFERENCE TO RELATED APPLICATIONS

This application is a Divisional of application Ser. No. 15/152,570 filed May 12, 2016, and included herein by reference.

BACKGROUND OF THE INVENTION

1. Field of the Invention

The present invention relates to a semiconductor device and method of forming the same, and more particularly, relates to FinFET semiconductor device with fine lattice structure and method of forming the same.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the Fin-FETS is still aiming to devices with smaller scales.

SUMMARY OF THE INVENTION

The present invention therefore provides a FinFET semiconductor device with fine lattice structure and method of forming the same.

According to one embodiment, the present invention provides a semiconductor device, including a substrate, a first semiconductor layer, a plurality of first sub recess, a plurality of insulation structures and a first top semiconductor layer. The substrate has a first region disposed between two STIs. The first semiconductor layer is disposed in the first region. The first sub recesses are disposed in the first semiconductor layer. The insulation structures are disposed on the first semiconductor layer. The first top semiconductor layer forms a plurality of fin structures, which are embedded in the first sub recesses, arranged alternatively with the insulation structures and protruding over the insulation structures.

According to another embodiment, the present invention provides a method of forming a semiconductor device. First, a substrate including a first region is provided, wherein the first region is disposed between two shallow trench isolations (STI). A first semiconductor layer is formed in the first region. Next, a patterned mask layer is formed on the first semiconductor layer, following by using the patterned mask layer as a mask to pattern the first semiconductor layer, thereby forming a plurality of first sub recesses. Then, a plurality of first fin structures are formed in the first sub recesses, and the patterned mask layer is removed to a predetermined height so the patterned mask layer becomes a plurality of insulation structures, wherein the insulation structures are arranged alternatively with the first fin structures.

Based on the semiconductor device and the method set forth in the present invention, which is characterized by using the semiconductor layer as a buffer layer, the formed fin structures can have good lattice structure and no fin cut process is required.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Please refer to FIG. 1A, FIG. 1B, FIG. 2, FIG. 3, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A and FIG. 11B, which are schematic diagrams of the method of forming a semiconductor device according to one embodiment of the present invention, wherein FIG. 1A, FIG. 3, FIG. 4A, FIG. 5A, FIG. 6A, FIG. 7A, FIG. 8A, FIG. 9A, FIG. 10A and FIG. 11A are cross sectional view and FIG. 1B, FIG. 3B, FIG. 4B, FIG. 5B, FIG. 6B, FIG. 7B, FIG. 8B, FIG. 9B, FIG. 10B and FIG. 11B are top view.

Figure 1A:
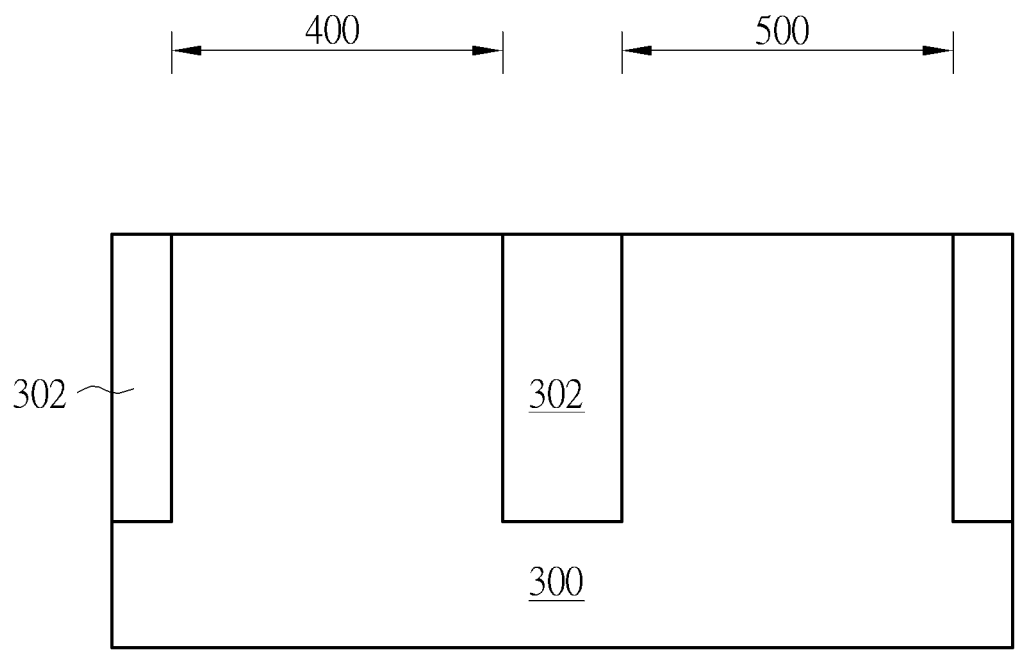
FIG. 1A, FIG. 1B, FIG. 2, FIG. 3, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A and FIG. 11B are schematic diagrams of the method of forming a semiconductor device according to one embodiment of the present invention.
Figure 1B:
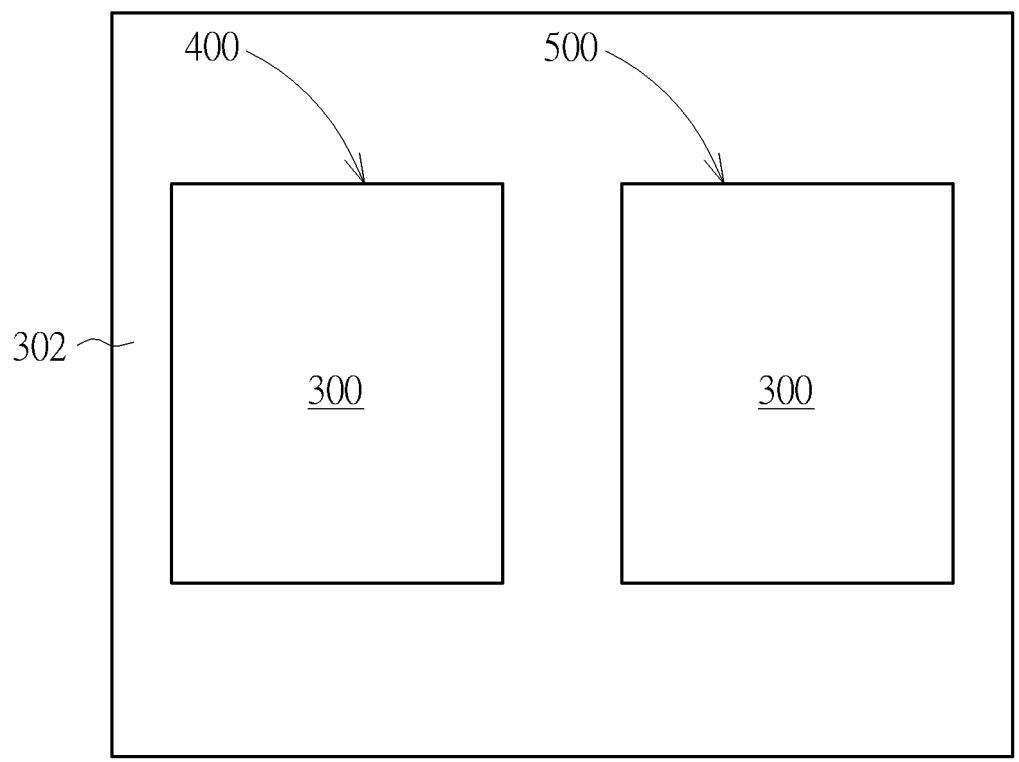

Please first see FIG. 1A and FIG. 1B, wherein FIG. 1A is illustrated by taking along line AA' of FIG. 1B. A semiconductor substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. A shallow trench isolation (STI) 302 is disposed on the substrate 300 and different areas surrounded by the STI 302 can be defined as different active regions. In the present embodiment, as shown in FIG. 1A and FIG. 1B, a first region 400 and a second region 500 are both surrounded by the STI 302, wherein the first region 400 is directly adjacent to the second region 500. In another embodiment, there can be other active regions disposed between the first region 400 and the second region 500, so the first region 400 can be not directly adjacent to the second region 500. In one embodiment, the first region 400 is an N-type transistor region and the second region 500 is a P-type transistor region. In another embodiment, the conductivity types of the first region 400 and the second region 500 can be the same.

Figure 2:
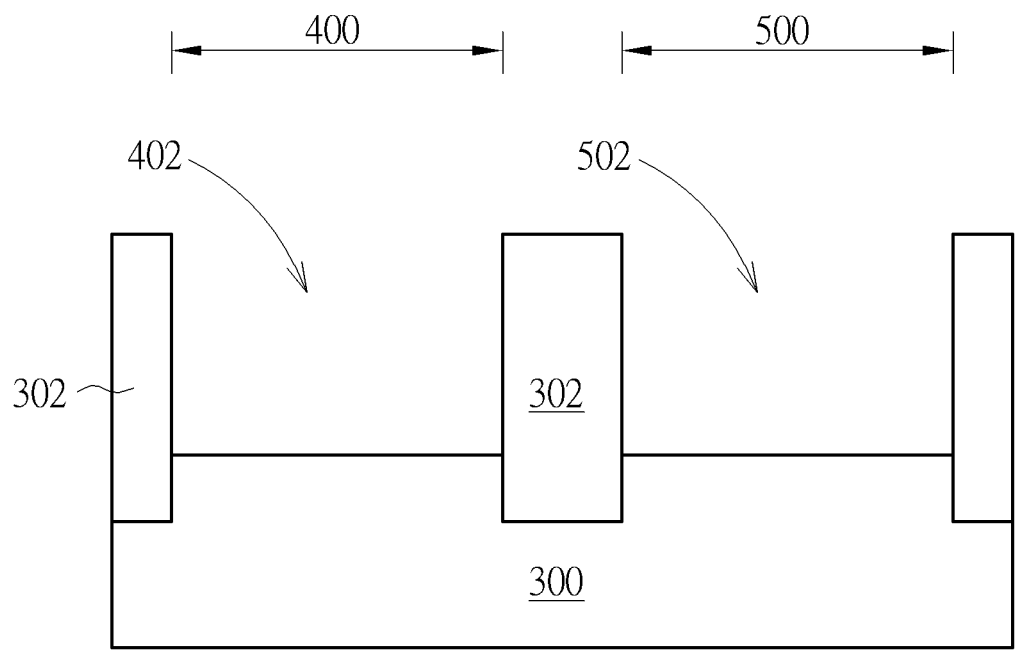

As shown in the cross sectional view in FIG. 2, a first trench 402 and a second trench 502 are formed respectively in the first region 400 and the second region 500. In one preferred embodiment, the first trench 402 corresponds exactly to the first region 400 and the second trench 502 corresponds exactly to the second region 500, meaning that the sidewalls of the first trench 402 and the second trench 502 are the sidewalls of the shallow trench isolation 302. The depth of the first trench 402 and the depth of the second trench 502 are not greater than the depth of the shallow trench isolation 302. In one embodiment, the depth of the first trench 402 is substantially equal to the depth of the second trench 502. In another embodiment, depending on the design of the subsequently formed epitaxial material, the depth of the first trench 402 may be different from that of the second trench 502.

Figure 3:
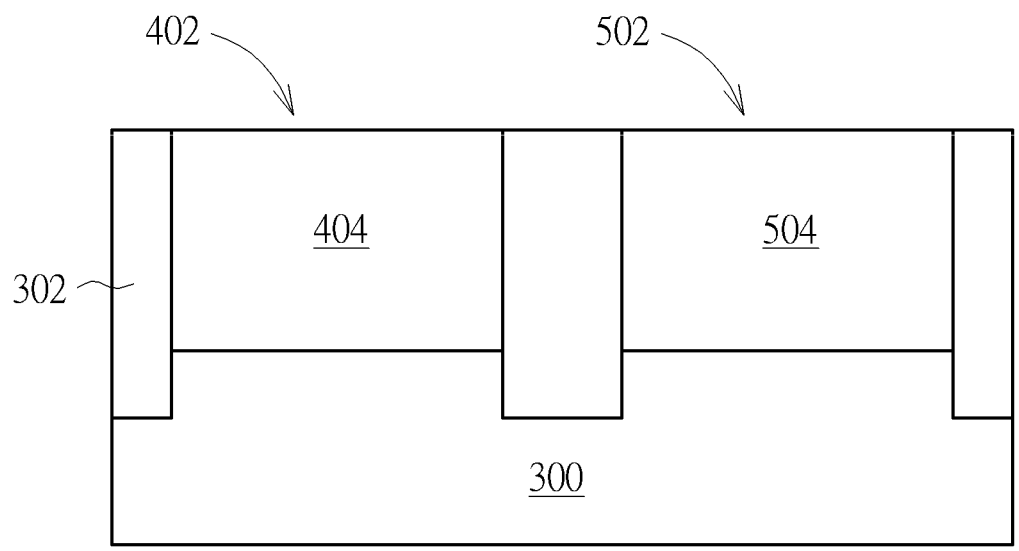

As shown in FIG. 3, a first semiconductor layer 404 is formed in the first trench 402 and a second semiconductor layer 504 is formed in the second trench 502. Preferably, the first semiconductor layer 404 and the second semiconductor layer 504 completely fill the first trench 402 and the second trench 502. In one embodiment, the step of forming the first semiconductor layer 404 and the second semiconductor layer 504 includes a selective epitaxial growth (SEG) process, wherein the first semiconductor layer 404 and the second semiconductor layer 504 can be formed by different SEG processes or the same SEG process. Thus, the first semiconductor layer 404 and the second semiconductor layer 504 can have the same material or different materials. After the formation of the first semiconductor layer 404 and the second semiconductor layer 504, an optional planarization process can be performed to make the top surface of the first semiconductor layer 404 and the second semiconductor layer 504 level with the top surface of the shallow trench isolation 302.

Figure 4A:
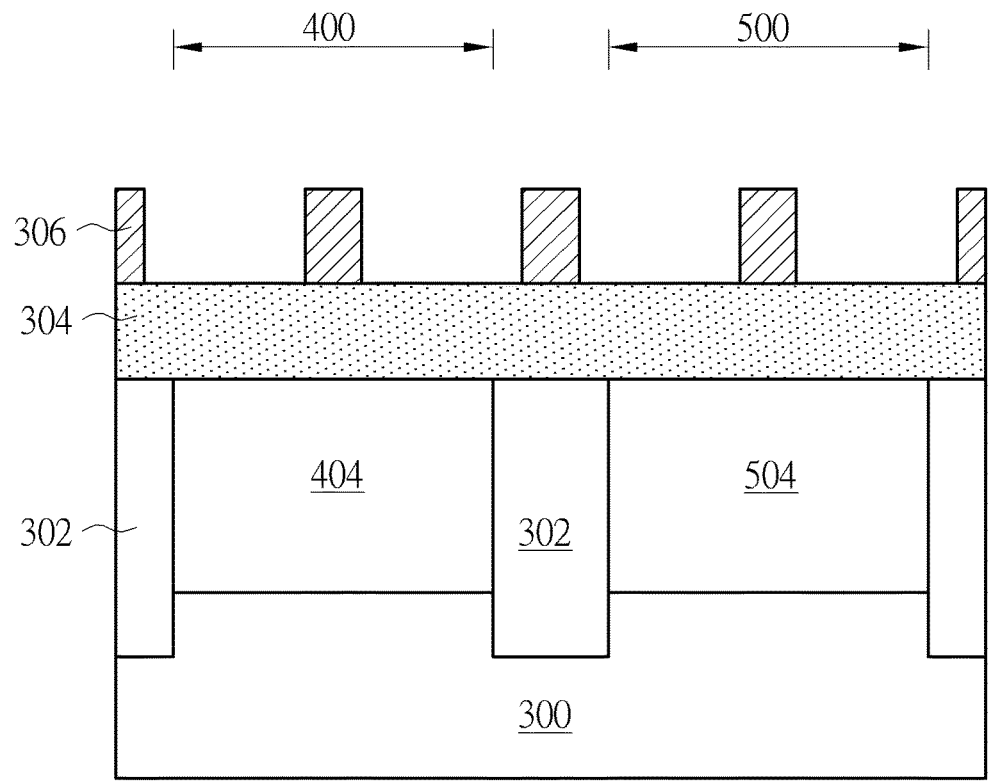
Figure 4B:
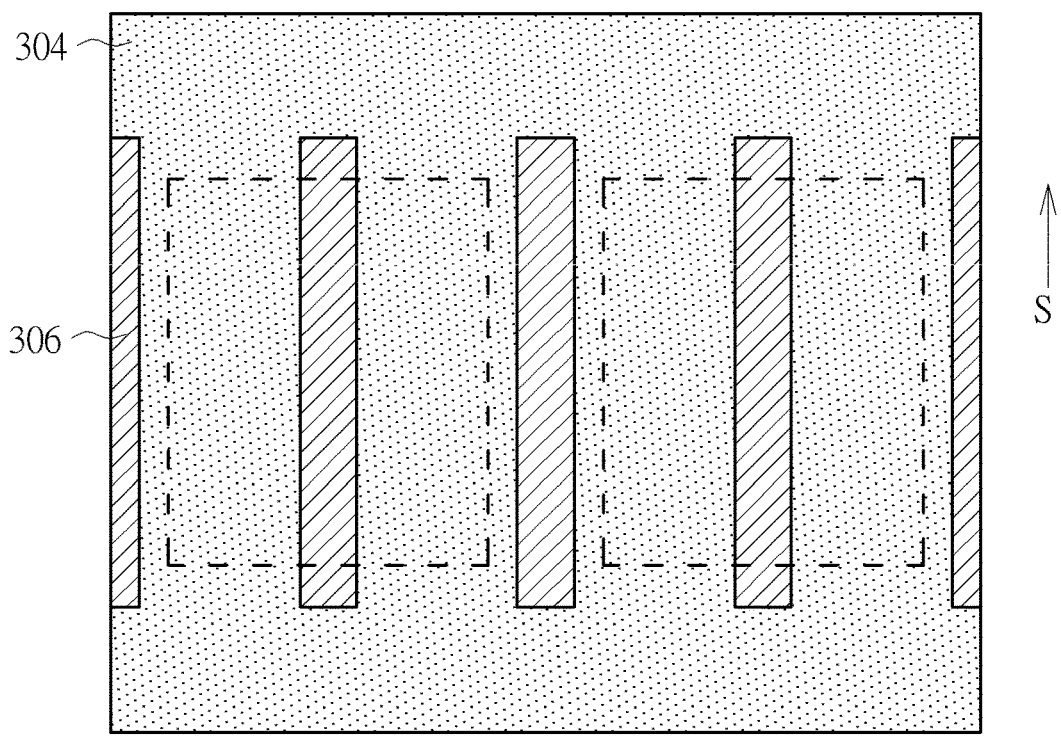

As shown in FIG. 4A and FIG. 4B, a mask layer 304 and a plurality of mandrels 306 are formed sequentially on the substrate 300. The mask layer 304 is formed comprehensively on the substrate 300 and the material thereof may include any material suitable as a mask in the subsequent etching process. Preferably, the mask layer 304 includes a dielectric layer with electrical isolation capability, such as silicon nitride (SiN), silicon oxynitride (SiON), silicon carbide (SiC) or advanced pattern film (APF) provided by Applied Materials Co., but is not limited thereto. The mandrels 306 can be made of poly-silicon or amorphous silicon. As shown in the top view of FIG. 4B, the mandrels 306 are stripe patterns, which are paralleled with each other and stretching along the same direction S. In one preferred embodiment, there is at least one mandrel 306 straddling across the first region 400, and there is at least one mandrel 306 straddling across the second region 500. Preferably, the mandrel 306 protrudes upwardly and downwardly over the first region 400 and/or the second region 500. In addition, there is at least one mandrel 306 disposed on the STI 302 which is between the first area 400 and the second region 500.

Figure 5A:
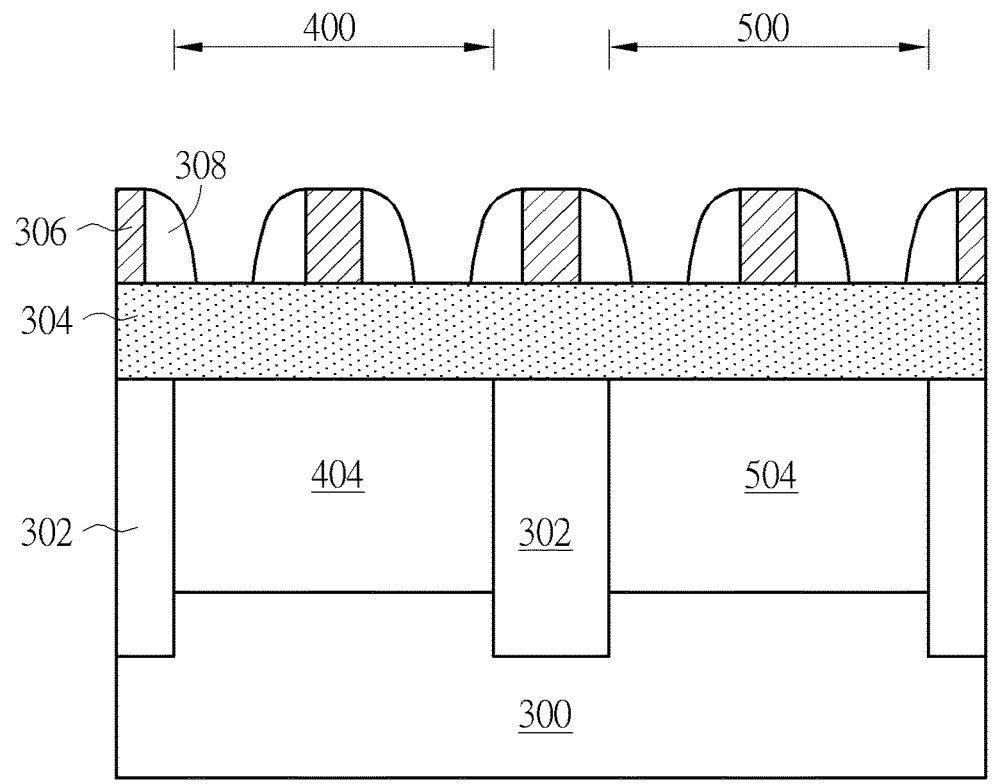
Figure 5B:
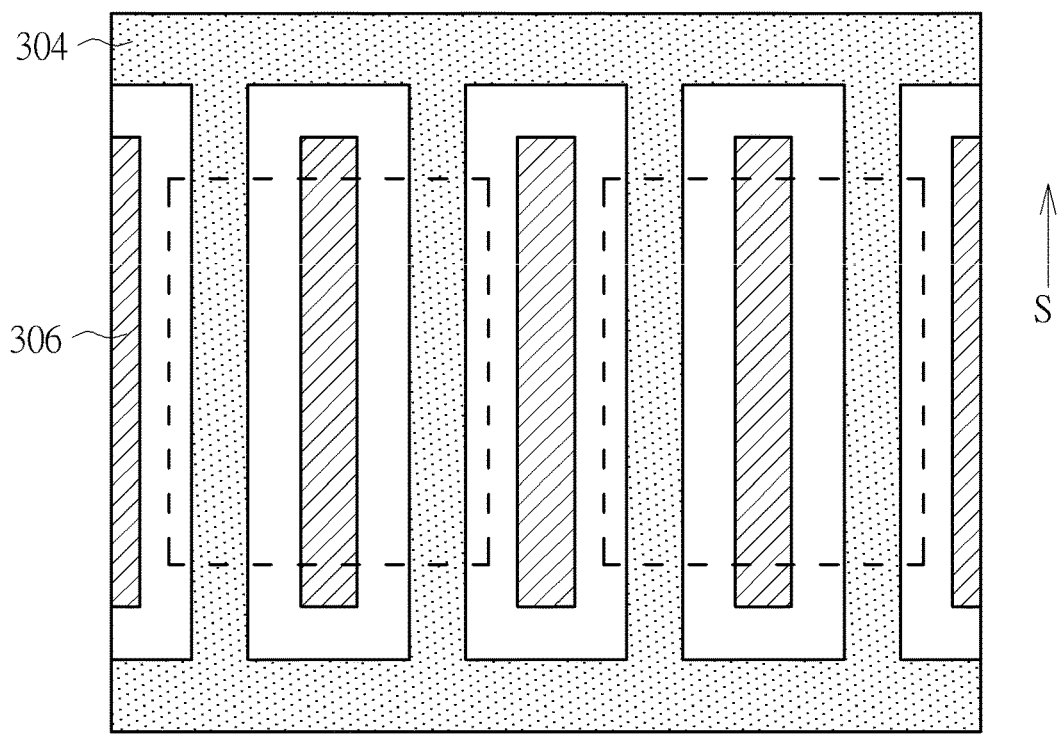

As shown in FIGS. 5A and 5B, a spacer 308 is formed on the sidewalls of each mandrel 306. The method of forming the spacer 308 includes, for example, forming a spacer material layer (not shown) comprehensively on the substrate 300 to conformally cover the top surface and the sidewalls of the mandrel 306, and then performing an anisotropic etching process to expose the top surface of the mandrels 306 so the spacer 308 is formed only on the sidewalls of the mandrel 306. Preferably, the spacer 308 includes materials having etching selectivity with respect to the mask layer 306, for example, silicon oxide, silicon nitride, high temperature oxide (HTO) or silicon nitride with precursors including hexachlorodisilane ($Si_2Cl_6$) (HCD-SiN), but is not limited thereto. As shown in the top view of FIG. 5B, the spacer 308 surrounds the sidewalls of the mandrel 306, and it is noted that in the area between the first region 400 and the second 500, the spacer 308 would cover a border of the first region 400 and a border of the second region 500.

Figure 6A:
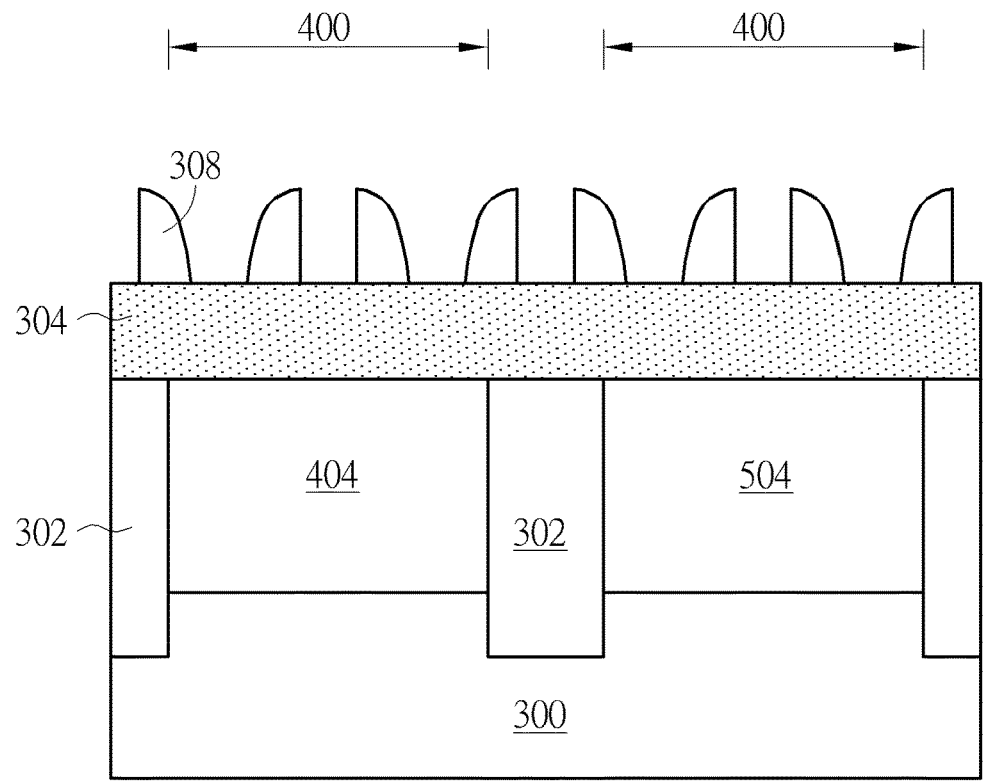
Figure 6B:
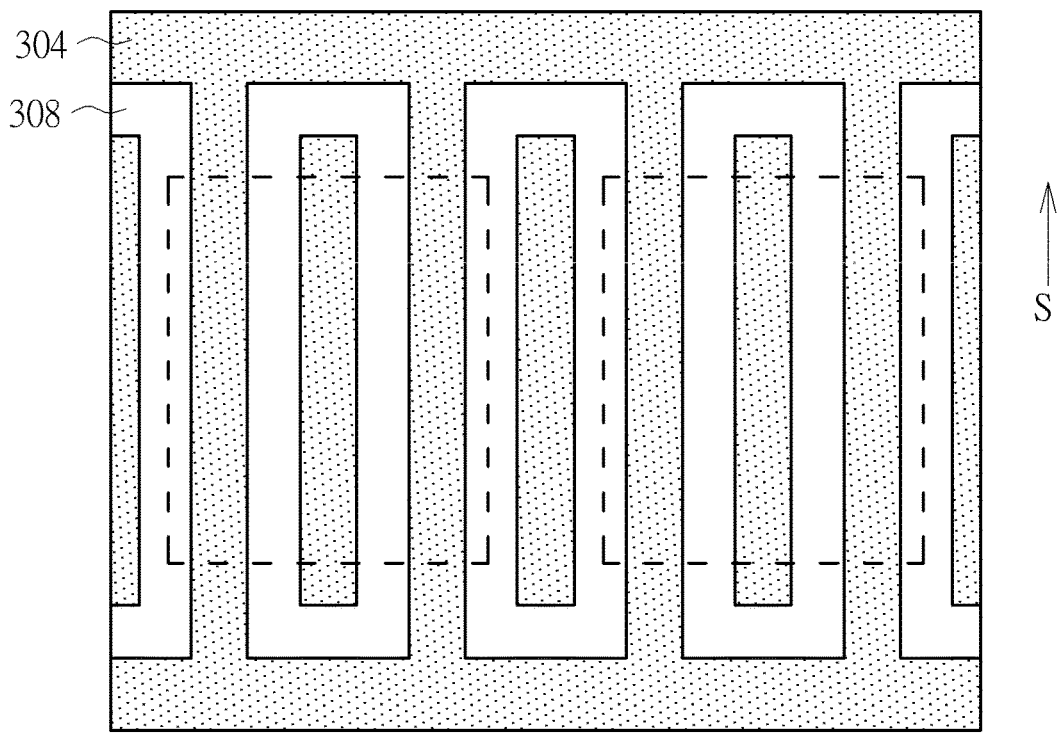

Next, as shown in FIG. 6A and FIG. 6B, the mandrels 306 are removed to expose the under mask layer 304. In one embodiment, when mandrels 306 includes poly-silicon, the removing step may be a dry etching step and/or a wet etching step, wherein the dry etching step includes using a gas mixture containing hydrogen bromide (HBr), nitrogen ($N_2$) and nitrogen trifluoride ($NF_3$), or containing boron trichloride ($BCl_3$), and the wet etching step includes using etchant containing tetramethyl ammonium hydroxide (TMAH).

Figure 7A:
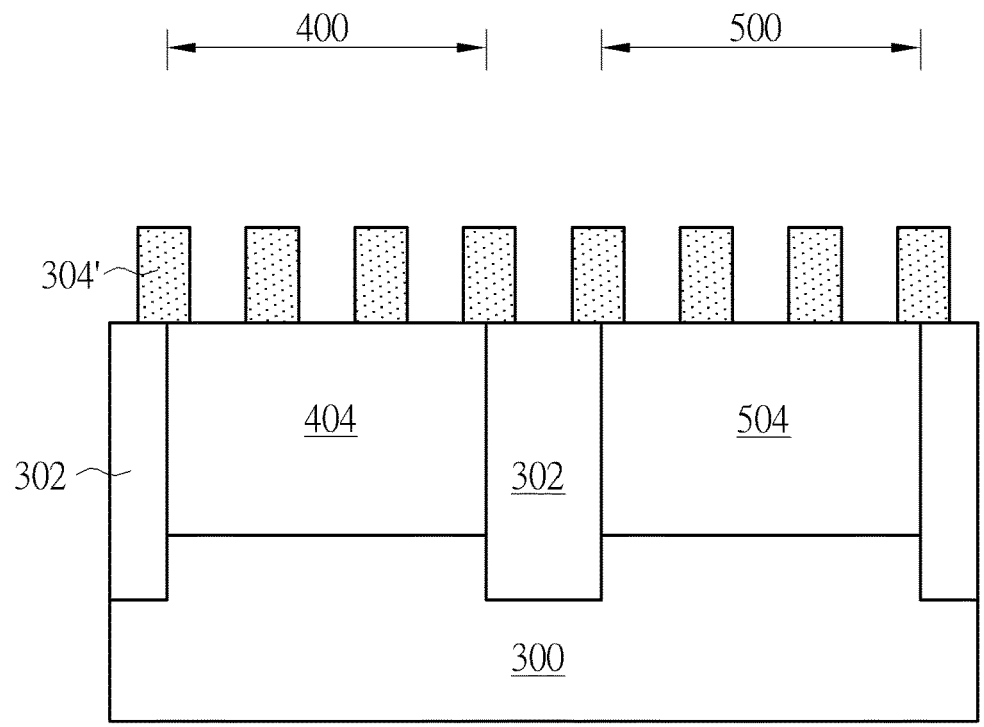
Figure 7B:
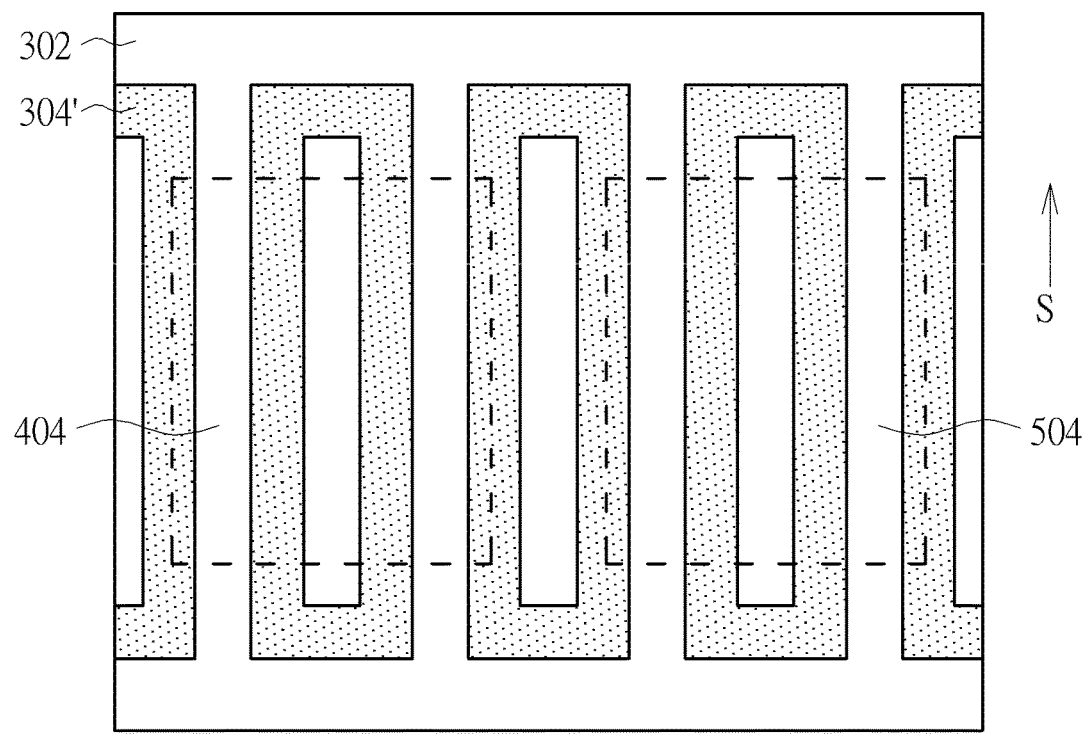

As shown in FIG. 7A and FIG. 7B, the mask layer 304 is patterned by using the spacer 308 as a mask to transfer the patterns thereof to the formed patterned mask layer 304', which may also include strip patterns. It is noted that the embodiment shown in FIG. 4A, FIG. 5A, FIG. 6A and FIG. 7A are exemplary embodiment of the sidewall image transfer (SIT) process for forming the patterned mask layer 304', and one skilled in the arts would understand that the patterned mask layer 304' can also be formed in other ways. For example, it can be formed by directly performing a lithography and patterning process for the mask layer 304 with forming appropriate stripe photo resist layers (not shown) thereon.

Figure 8A:
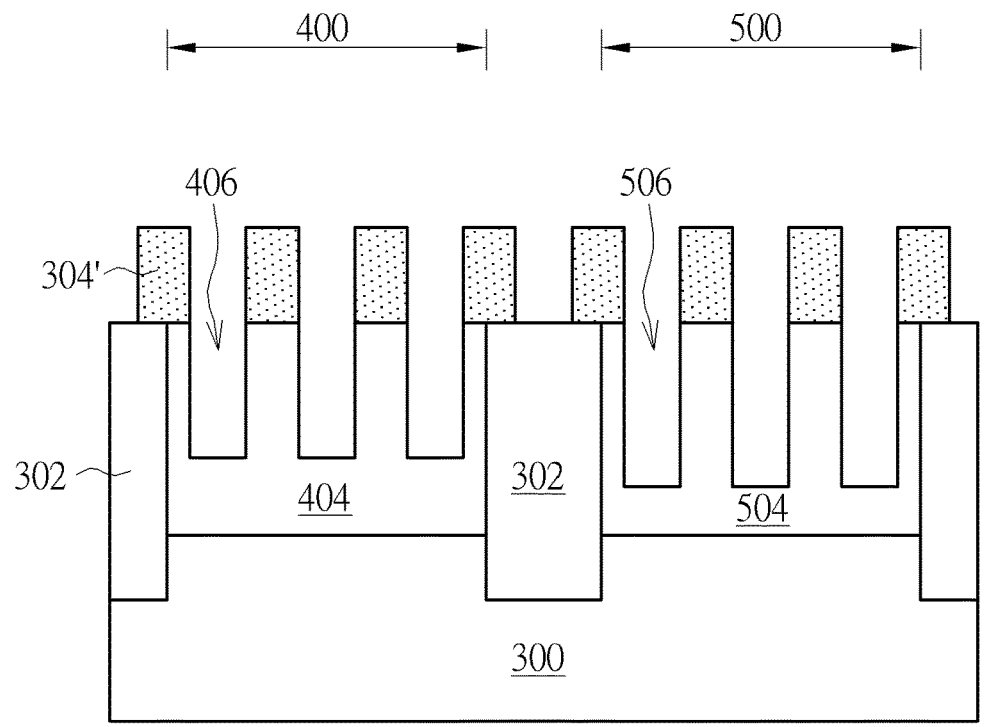
Figure 8B:
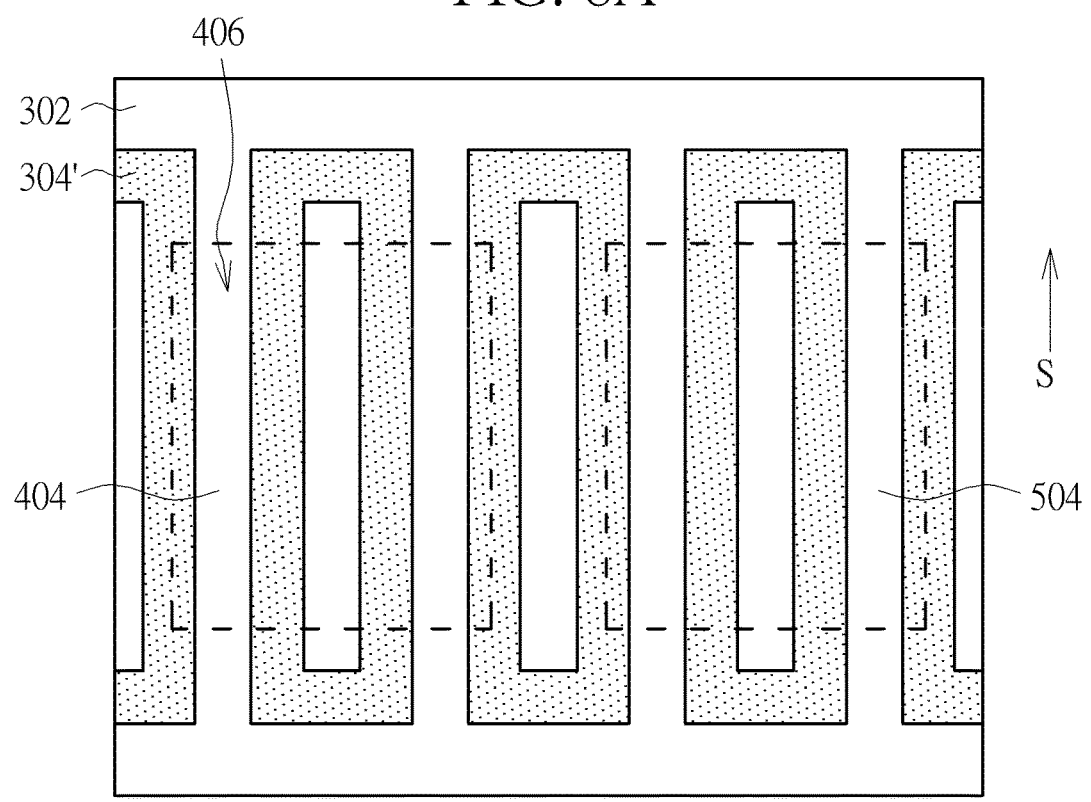

As shown in FIG. 8A and in FIG. 8B, the first semiconductor layer 404 and the second semiconductor layer 504 are patterned by using the patterned mask layer 304' as a mask, to form a plurality of first sub recesses 406 in the first semiconductor layer 404 and a plurality of second sub recesses 506 in the second semiconductor layer 504. In one preferred embodiment of the present invention, by adjusting the position and/or width of the mandrels 306, and/or the width of the spacer 308, same size of the first sub recesses 406 or second sub recesses 506 can be obtained. Please again refer to FIG. 6A and FIG. 6B, since the spacer 308 are formed above one boundary of the first region 400 and one boundary of the second region 500, the pattern thereof is not affected by the shallow trench isolation 302 during the patterning process so the contours of the first sub recesses 406 and the second sub recesses 506 can be of the same size. In another embodiment of the present invention, the first sub recesses 406 and the second sub recesses 506 can have different depths or different widths, as shown in FIG. 8A, the depth of the second sub recesses 506 are greater than the depth of the first sub recesses 406.

Figure 9A:
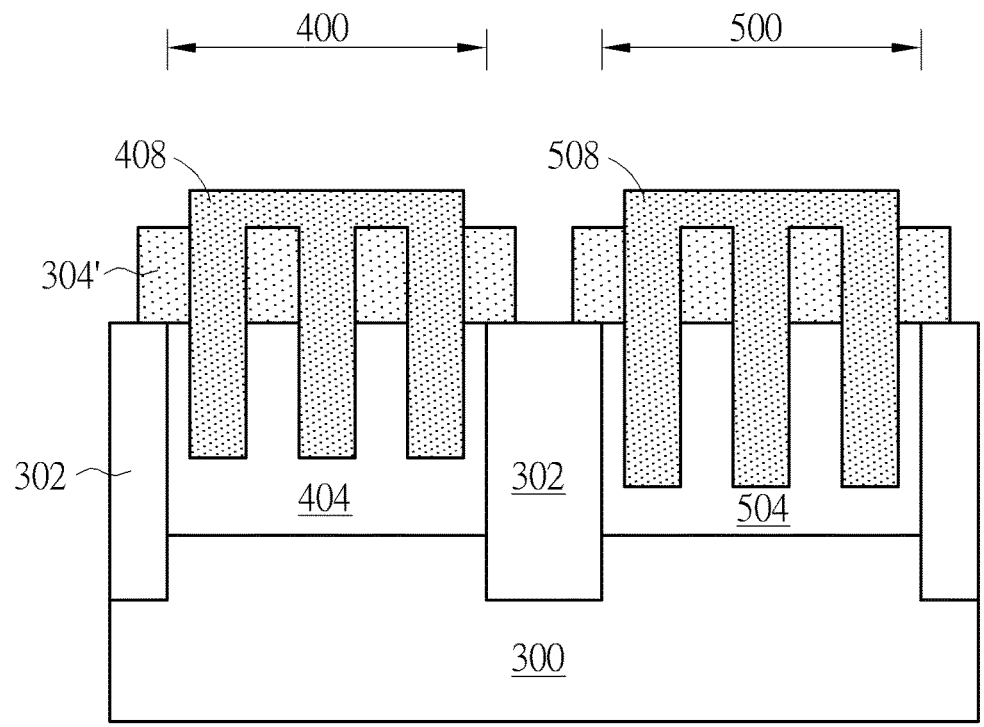
Figure 9B:
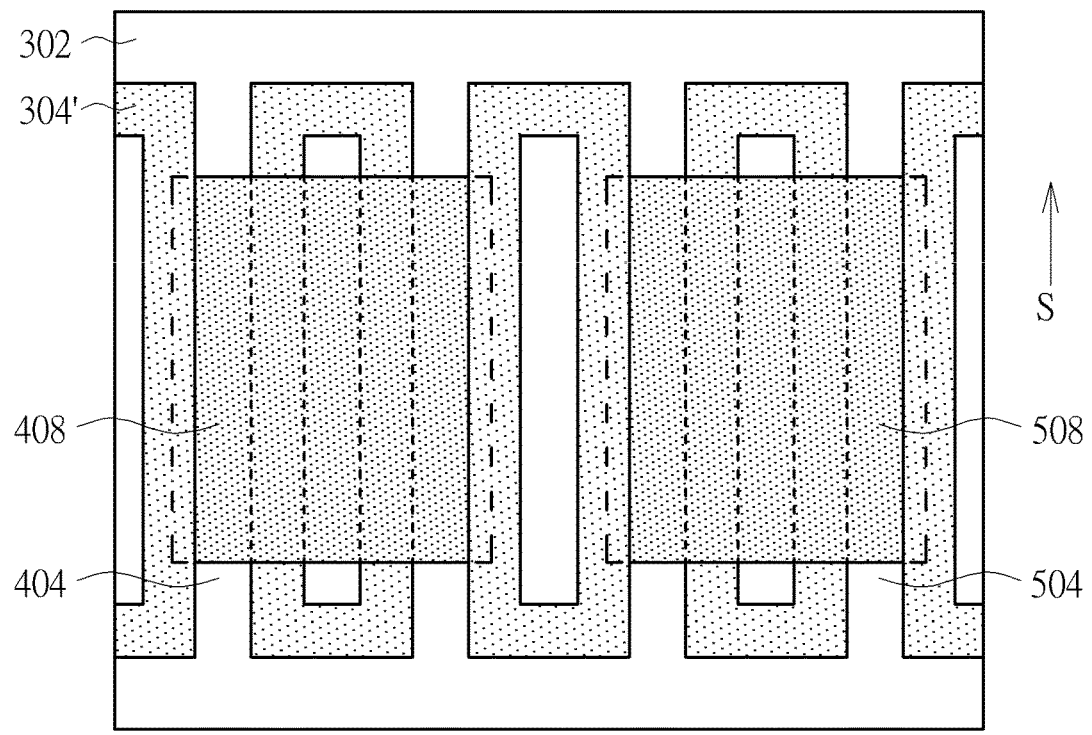

As shown in FIG. 9A and FIG. 9B, at least one selective epitaxial growth (SEG) process is performed to form a first top semiconductor layer 408 on the first semiconductor layer 404 and a second top semiconductor layer 508 on the second semiconductor layer 504. The first top semiconductor layer 408 completely fills the first sub recesses 406, and the second top semiconductor layer 508 completely fills the second sub recesses 506. Preferably, both of which protrude upwardly over the substrate 300, and more preferably, protrude over top surface of the patterned mask layer 304'. The first top semiconductor layer 408 and the second top semiconductor layer 508 may be formed by the same or different epitaxial processes, so the materials thereof may be the same or different.

Figure 10A:
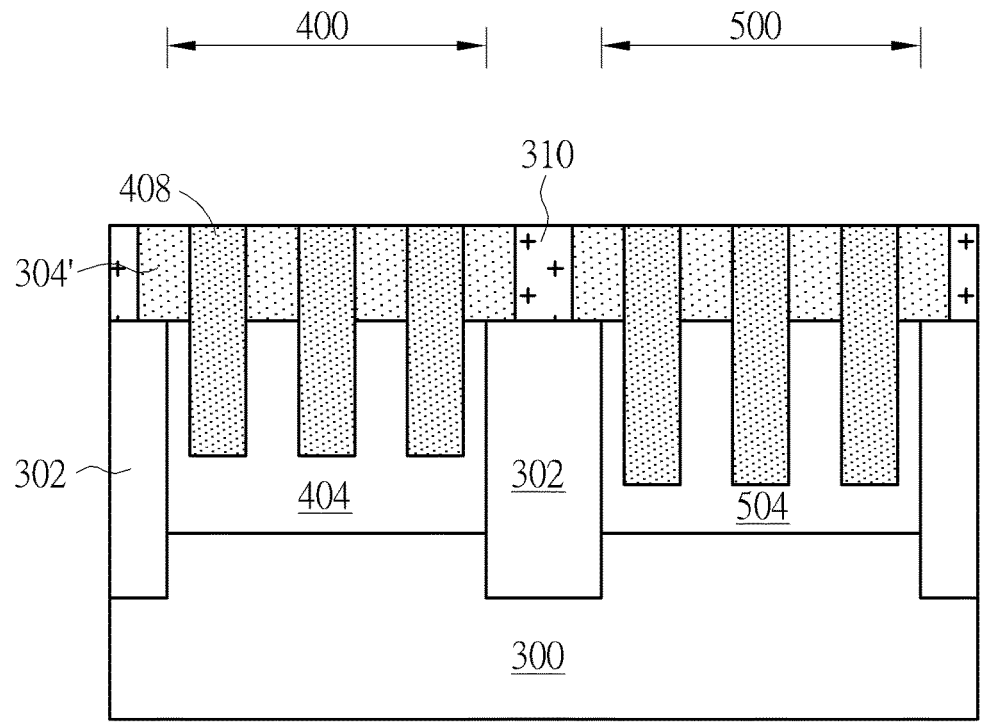
Figure 10B:
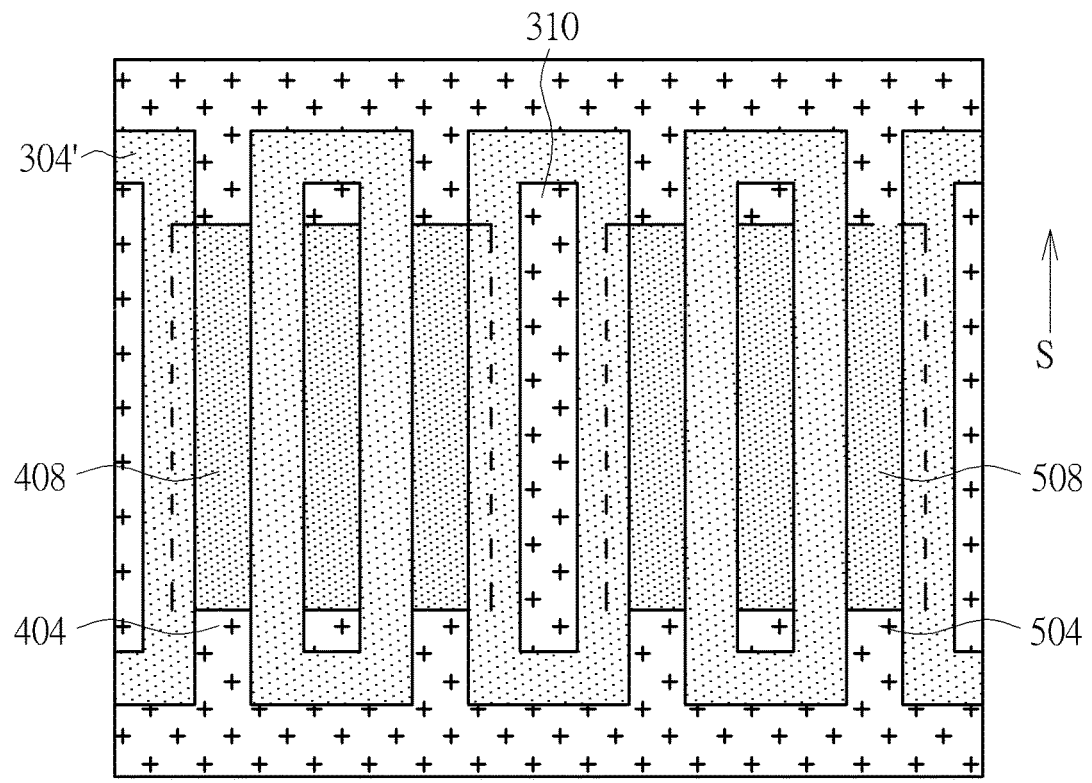

As shown in FIG. 10A and FIG. 10B, a planarization process is carried out to make the top surface of the first top semiconductor layer 408 and the top surface of the second top semiconductor layer 508 level with the top surface of the patterned mask layer 304'. In one embodiment, before the planarization process, a dielectric material such as silicon dioxide can be filled into the area not filled with epitaxial material, so as to increase the reliability of the planarization process. For example, a silicon oxide layer is filled into the area between the first region 400 and the second region 500, thereby forming a dummy fin structure 310 on the shallow trench isolation 302.

Figure 11A:
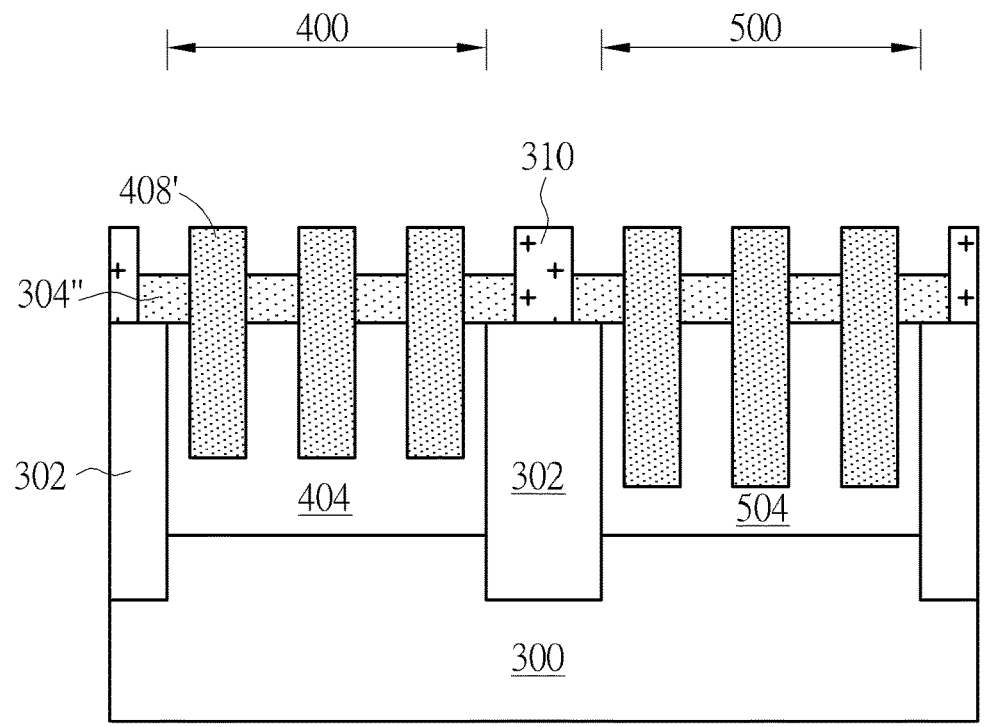
Figure 11B:
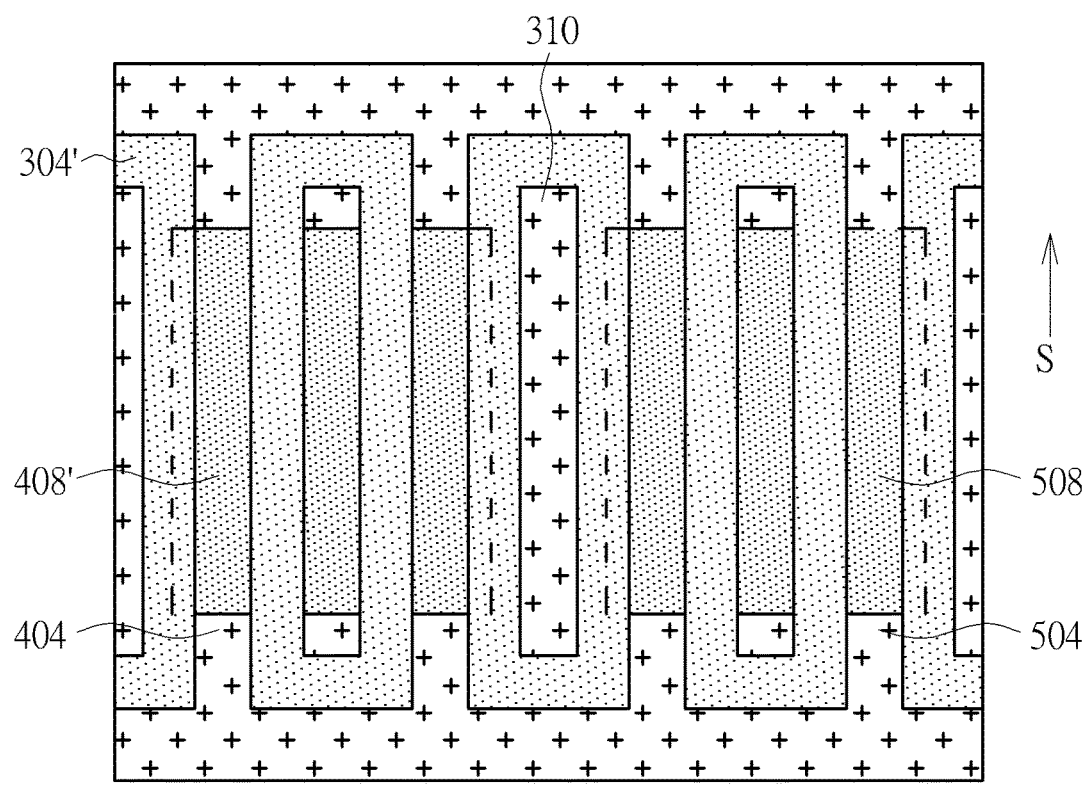

As shown in FIG. 11A and FIG. 11B, an etching back process is performed to remove a portion of the patterned mask layer 304' to a predetermined height so that it becomes a plurality of insulation structures 304" and the first top semiconductor layer 408 becomes a plurality of first fin structures 408', the second top semiconductor layer 508 becomes a plurality of second fin structures 508'. By doing this, the semiconductor device of the present invention is therefore obtained. As shown in FIG. 11A and FIG. 11B, the semiconductor device of the present invention in the first region 400 includes a substrate 300 having a shallow trench isolation 302, a first semiconductor layer 404, a plurality of first sub recesses 406 and a plurality of first fin structures 408'. The first semiconductor layer 404 is surrounded by the shallow trench isolation 302, and the top surface of the first semiconductor layer 404 is leveled with the top surface of the shallow trench isolation 302. The first sub recesses 406 are disposed in the first semiconductor layer 404, and the insulation structures 304" are disposed on the first semiconductor layer 404. The first fin structures 408', which are formed from the first top semiconductor layer 408, are embedded in the first sub recesses 406, wherein the first fin structures 408' are arranged alternatively with and protrude from the insulation structures 304". In the second region 500, the components are similar to those in the first region 400. In one embodiment, the second semiconductor layer 504 has a material different from that of the first semiconductor layer 408. In one embodiment, the width and/or the depth and/or the material of the second fin structures 508' can be different from that of the first fin structures 408. In one embodiment, the dummy fin structure 310 has a height substantially equal to that of the first fin structure 508. In another embodiment, when the dummy fin structure 310 has a material with a relatively small etching selection relatively with respect to the patterned mask layer 304', the etching back process shown in FIG. 11A and FIG. 11B may therefore remove a small portion of the dummy fin structure 310, so the top surface of the dummy fin structure 310 is slightly lower than the top surface of the first fin structures 408'.

The present invention is advantageous in that, as shown in the cross sectional view of FIG. 11B, the first fin structures 408 can be automatically aligned and formed in the first sub recesses 406 in the first region 400 and are not formed outsides the first region 400. Accordingly, no additional fin cut process in conventional sidewall transfer image process is required and a fine sidewall pattern with smaller critical dimension can still be obtained.

Since the present invention uses epitaxial growth process to form the first semiconductor layer 404, the second semiconductor layer 504, the first top semiconductor layer 408 (later becomes the first fin structure 408') and the second top semiconductor layer 508 (later becomes the second fin structure 508'), the first semiconductor layer 404 and the second semiconductor layer 504 can serve as a buffer layer for lattice growth, which may have a small number of dislocations, but making the first fin structures 408' and the second fin structures 508' exhibit good lattice property without dislocations. In one embodiment, the first semiconductor layer 404 and the first fin structures 408' formed from the first top semiconductor layer 408 have different lattice coefficients (lattice mismatch). In another embodiment, the first semiconductor layer 404, the first fin structures 408' and the substrate 300 have different lattice coefficients (lattice mismatch). In one embodiment, if the first region 400 is an N type region, the first semiconductor layer 404, the second semiconductor layer 504, the first fin structures 408' and the second fin structures 508' may include silicon, silicon germanium, germanium, arsenic, or other IV elements. Preferably, in order to increase the channel stress of the fin structures, the first semiconductor layer 404 or the second semiconductor layer 504 may be doped with IV elements with different atomic sizes, such as carbon (C) or tin (Sn), and its concentration may have gradient depending on the designs of the products.

Figure 12:
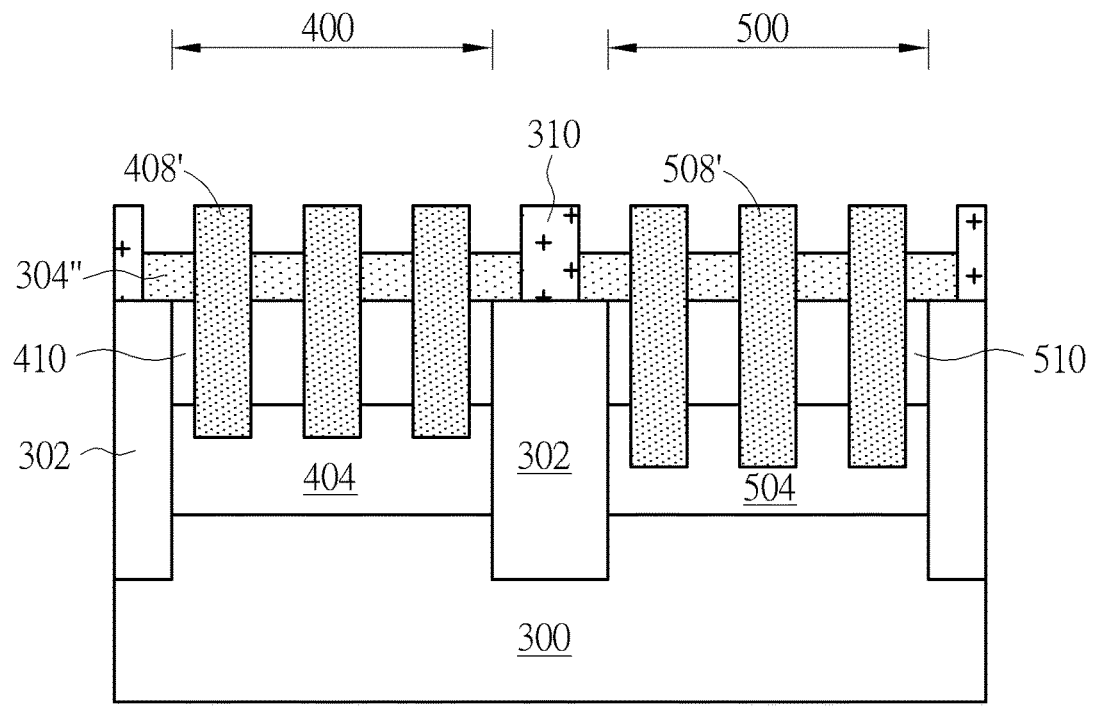
FIG. 12 is a schematic diagram of the semiconductor device according to another embodiment of the present invention.
Figure 13:
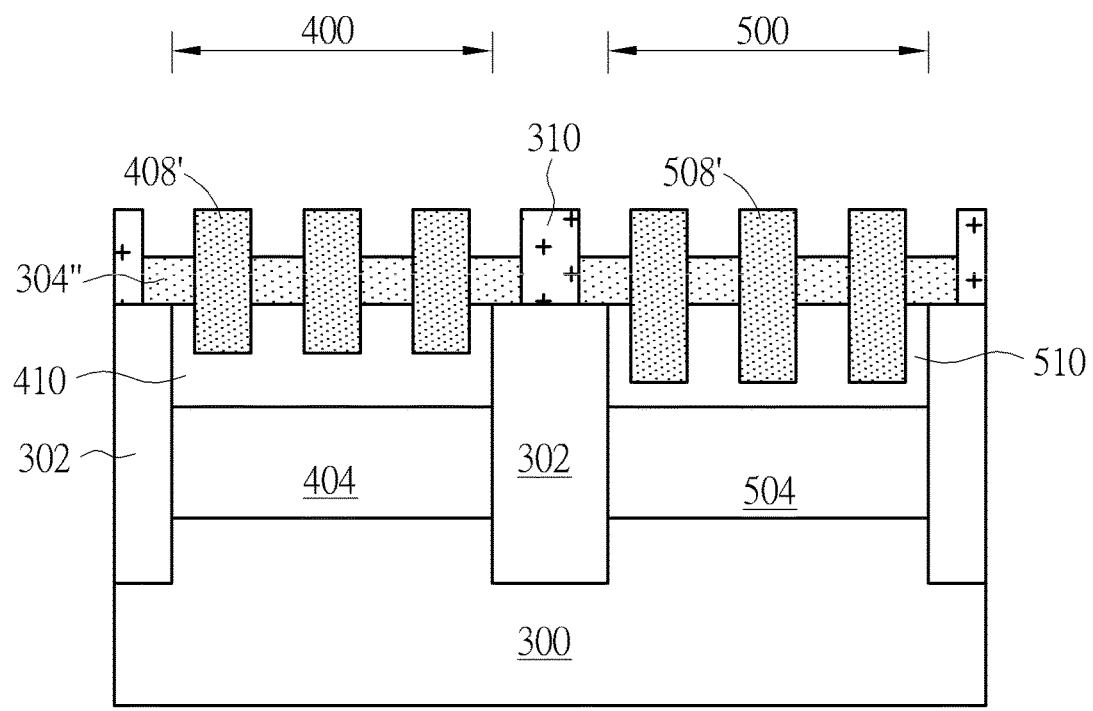
FIG. 13 is a schematic diagram of the semiconductor device according to another embodiment of the present invention.

Please refer to FIG. 12, which shows a schematic diagram of the semiconductor device according to another embodiment of the present invention. The semiconductor device of the present embodiment further includes a first middle semiconductor layer 410 disposed between the first semiconductor layer 404 and insulation structures 304", and a second middle semiconductor layer 510 disposed between the second semiconductor layer 504 and the insulation structures 304". In one embodiment, the top surface of the first middle semiconductor layer 410 and the top surface of the second middle semiconductor layer 510 are leveled with the top surface of the shallow trench isolation 302. The first middle semiconductor layer 410 and the second middle semiconductor layer 510 may be formed after formation of the first semiconductor layer 404 and the second semiconductor layer 504 (as shown in FIG. 4A and FIG. 4B), removing top portions of the first semiconductor layer 404 and the second semiconductor layer 504, and formed by an epitaxial growth process, for example. By the formation of the first middle semiconductor layer 410 and the second middle semiconductor layer 510, the lattice property of the first fin structures 408' and the second fin structures 508' can further be upgraded. Please refer to FIG. 13, which shows a schematic diagram of the semiconductor device according to another embodiment of the present invention. Comparing to the embodiment shown in FIG. 12 that first fin structures 408' contact the first semiconductor layer 404, the first fin structures 408' in the present embodiment are embedded only in the first middle semiconductor layer 410 and do not contact the first semiconductor layer 404, as illustrated in FIG. 13. Similarly, the second fin structures 508' are embedded only in the second middle semiconductor layer 510 and do not contact the second semiconductor layer 504.

Figure 14:
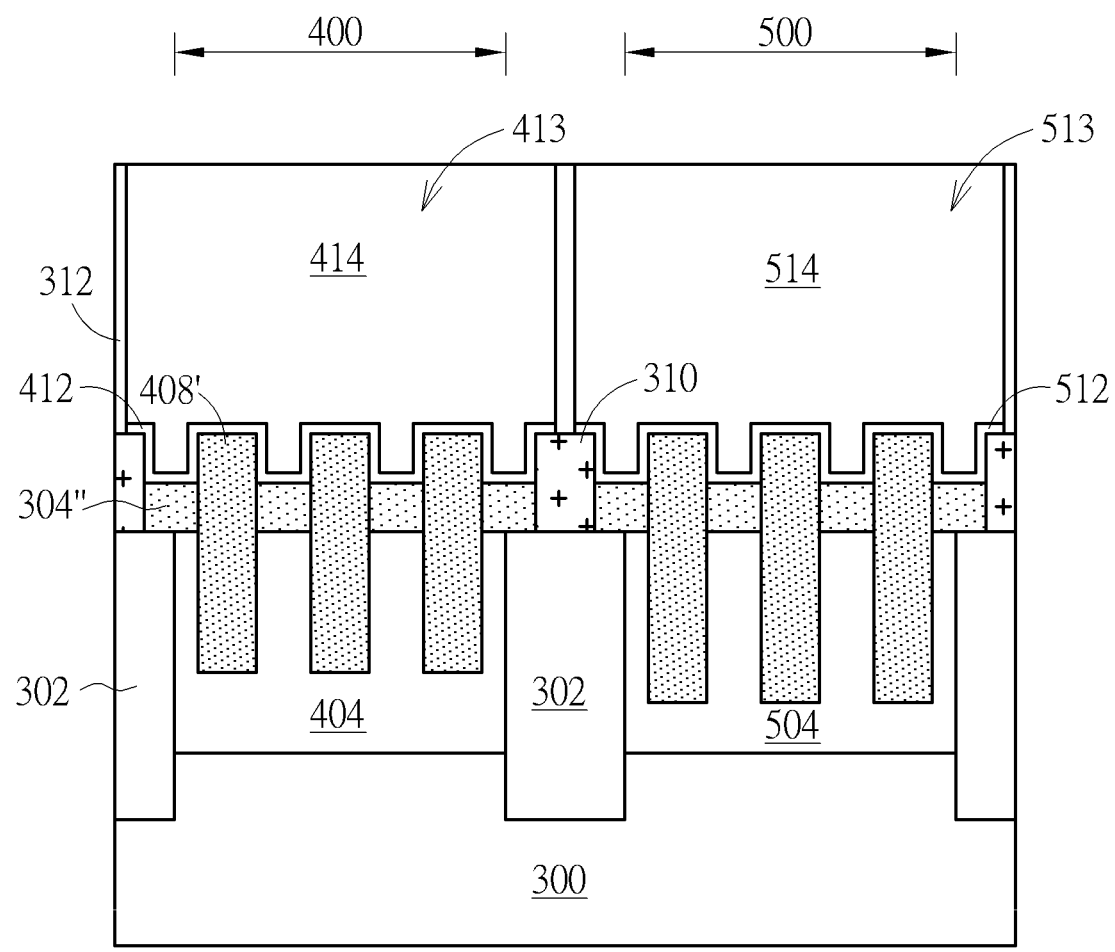
FIG. 14 is a schematic diagram of the method including a semiconductor metal gate displacement process.

The semiconductor device with the first fin structures 408' and the second fin structures 508' formed by the method of the present invention can be subjected to other semiconductor processes, for instance, forming a gate dielectric layer (not shown) and a gate layer (not) on the fin structures and then forming a source/drain region, thereby forming a transistor. Alternatively, the method can be in conjugation with other transistor formation process, such as a metal replacement gate process. Please refer to FIG. 14, which shows a schematic diagram of the method including a semiconductor metal gate displacement process. As shown in FIG. 14, after forming an interlayer dielectric layer 312 and removing the dummy gate, a trench 413 and a trench 513 are formed. In one embodiment, the sidewalls of the trench 413 and the sidewalls of the trench 513 are located above the dummy fin structure 310 on the shallow trench isolation 302. Subsequently, a first gate dielectric layer 412 and a second gate dielectric layer 512 are formed on the first fin structures 408' and the second fin structures 508', following by filling a first metal gate 414 and a second metal gate 514 respectively in the recess 413 and the recess 513. Since the sidewalls of the recess 413 and the recess 513 correspond to the dummy fin structure 310, there is a larger space margin to form the first metal gate 414 and the second metal gate 514.

In summary, according to the semiconductor device and the method set forth in the present invention, which is characterized by using the semiconductor layer as a buffer layer, the formed fin structures can have fin lattice structure and no fin cut process is required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:
   providing a substrate including a first region, wherein the first region is disposed between two shallow trench isolations (STI);
   forming a first semiconductor layer in the first region using a selective epitaxial growth (SEG) process;
   forming a patterned mask layer having a plurality of separated mask patterns on the first semiconductor layer, the separated mask patterns directly in contact with the first semiconductor layer;
   patterning the first semiconductor layer by using the patterned mask layer as a mask, thereby forming a plurality of first sub recesses in the first semiconductor layer;
   forming a plurality of first fin structures in the first sub recesses, with top surfaces of the first fin structures and a top surface of the patterned mask layer being aligned; and
   removing the patterned mask layer to a predetermined height so the patterned mask layer becomes a plurality of insulation structures, wherein the insulation structures are arranged alternatively with the first fin structures, with top surfaces of the insulation structures being lower than the top surfaces of the first fin structures.

2. The method of forming a semiconductor structure according to claim 1, wherein the patterned mask layer covers at least one boundary between the first region and the STI.

3. The method of forming a semiconductor structure according to claim 1, wherein the first fin structures are epitaxial material made of silicon, silicon germanium, germanium, arsenic, or other IV elements.

4. The method of forming a semiconductor structure according to claim 3, wherein the first fin structures are formed from the first semiconductor layer exposed from the first sub recesses, and each of the first fin structures has a plurality of extending segments above the top surface of the patterned mask layer.

5. The method of forming a semiconductor structure according to claim 1, further comprising:
   forming a dielectric dummy fin structure on each of the two shallow trench isolations.

6. The method of forming a semiconductor structure according to claim 5, further comprising:
   forming a metal gate completely covering the first fin structures and partially covering the dielectric dummy fin structure.

7. The method of forming a semiconductor structure according to claim 1, further comprising:
   forming a second region separated from the first region in the substrate.

8. The method of forming a semiconductor structure according to claim 7, further comprising:
   forming a second semiconductor layer in the second region;
   forming a plurality of second sub recesses in the second semiconductor layer;
   forming the insulation structures, disposed on the second semiconductor layer; and
   forming a plurality of second fin structures in the second sub recesses, wherein the second fin structures are arranged alternatively with the insulation structures.

9. The method of forming a semiconductor structure according to claim 1, further comprising:
   forming a first middle semiconductor layer disposed between the first semiconductor layer and the insulation structures.

10. The method of forming a semiconductor structure according to claim 9, wherein a boundary between the first middle semiconductor layer and the first semiconductor layer is higher than a top surface of the first fin structure.

11. The method of forming a semiconductor structure according to claim 9, wherein the first middle semiconductor layer, the first semiconductor layer and the first fin structures comprise different epitaxial materials.

12. The method of forming a semiconductor structure according to claim 9, there are lattice mismatch between the first semiconductor layer, the first middle semiconductor layer and the first fin structures.

13. The method of forming a semiconductor structure according to claim 9, wherein the first fin structures do not directly contact the first semiconductor layer.

14. The method of forming a semiconductor structure according to claim 1, there are lattice mismatch between the first semiconductor layer, the first fin structures and the substrate.

15. The method of forming a semiconductor structure according to claim 1, wherein forming a first trench in the first region, and a depth of the first trench is not greater than a depth of the shallow trench isolations.

* * * * *